United States Patent
Donald et al.

(10) Patent No.: US 6,596,973 B1
(45) Date of Patent: Jul. 22, 2003

(54) PYROMETER CALIBRATED WAFER TEMPERATURE ESTIMATOR

(75) Inventors: James J. Donald, Phoenix, AZ (US); Ivo Raaijmakers, Bilthoven (NL)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/096,138

(22) Filed: Mar. 7, 2002

(51) Int. Cl.[7] .................................................. F27B 5/14
(52) U.S. Cl. ........................ 219/390; 219/411; 219/497; 219/501; 118/725; 118/50.1; 392/416; 392/418
(58) Field of Search ................................ 219/390, 405, 219/411, 497, 486, 499, 501, 121.43, 121.4; 392/416, 418; 118/724, 725, 50.1

(56) References Cited

U.S. PATENT DOCUMENTS

| | | |
|---|---|---|
| 3,796,099 A | 3/1974 | Shimotsuma et al. |
| 3,969,943 A | 7/1976 | Ohno et al. |
| 4,435,092 A | 3/1984 | Iuchi |
| 4,854,727 A | 8/1989 | Pecot et al. |
| 4,890,245 A | 12/1989 | Yomoto et al. |
| 4,913,790 A | 4/1990 | Narita et al. |
| 4,919,542 A | 4/1990 | Nulman et al. |
| 4,969,748 A | 11/1990 | Crowley et al. |
| 4,984,902 A | 1/1991 | Crowley et al. |
| 5,098,198 A | 3/1992 | Nulman et al. |
| 5,156,461 A | 10/1992 | Moslehi et al. |
| 5,225,245 A | 7/1993 | Ohta et al. |
| 5,377,126 A | 12/1994 | Flik et al. |
| 5,549,756 A | 8/1996 | Sorensen et al. |
| 5,707,146 A | 1/1998 | Gaus et al. |
| 5,743,644 A | 4/1998 | Kobayashi et al. |
| 5,802,099 A | 9/1998 | Curran et al. |
| 5,830,277 A | 11/1998 | Johnsgard et al. |
| 5,875,416 A | 2/1999 | Kanno |
| 6,080,969 A | 6/2000 | Goto et al. |
| 6,191,399 B1 * | 2/2001 | Van Bilsen .................. 219/497 |
| 6,207,936 B1 | 3/2001 | De Waard et al. |

FOREIGN PATENT DOCUMENTS

JP          1-114727         8/1989

* cited by examiner

Primary Examiner—Teresa Walberg
Assistant Examiner—Shawntina Fuqua
(74) Attorney, Agent, or Firm—Knobbe, Martens, Olson & Bear, LLP

(57) ABSTRACT

A wafer temperature estimator calibrates contact-type temperature sensor measurements that are used by a temperature controller to control substrate temperature in a high temperature processing chamber. Wafer temperature estimator parameters provide an estimated wafer temperature from contact-type temperature sensor measurements. The estimator parameters are refined using non-contact-type temperature sensor measurements during periods when the substrate temperature is decreasing or the heaters are off. A corresponding temperature control system includes a heater, a contact-type temperature sensor in close proximity to the substrate, and an optical pyrometer placed to read temperature directly from the substrate. A wafer temperature estimator uses the estimator parameters and measurements from the contact-type sensor to determine an estimated wafer temperature. A temperature controller reads the estimated wafer temperature and makes changes to the heater power accordingly. The wafer temperature estimator has a nonlinear neural network system that is trained using inputs from the various sensors.

21 Claims, 6 Drawing Sheets

PYROMETER CALIBRATED WAFER TEMPERATURE ESTIMATOR

FIELD OF THE INVENTION

This invention relates generally to semiconductor processing, and more specifically to measuring and calibrating a substrate temperature sensor during processing.

BACKGROUND OF THE INVENTION

High-temperature processing chambers are used for depositing various material layers onto semiconductor substrates. A substrate, such as a silicon wafer, is placed on a wafer support inside the reactor. Both wafer and support are heated to a desired temperature. In typical wafer treatment step, reactant gases are passed over the heated wafer, causing the chemical vapor deposition (CVD) of a thin layer of the reactant material onto the wafer. Throughout subsequent depositions, doping, lithography, etch and other processes, these layers are made into integrated circuits, producing from tens to thousands, or even millions, of integrated devices, depending on the wafer size and the circuits' complexity.

Various process parameters are carefully controlled to ensure the high quality of the deposited layers. One such critical parameter is the wafer temperature. During CVD, for example, the deposition gases react within particular prescribed temperature ranges for deposition onto the wafer. A change in temperature can result in a change in deposition rate and an undesirable layer thickness. Accordingly, it is important to accurately control the wafer temperature to bring the wafer to the desired temperature before the treatment begins and to maintain desired temperatures throughout the process Currently temperature control systems modify heating lamp power in response to temperature readings from thermocouples mounted around and below the substrate. For several reasons, the thermocouple measurements give only an estimate of the actual wafer temperature. One reason is that the wafer responds much faster to changes in heating from the lamps than do the thermocouples. Whereas the wafer undergoes relatively fast radiant heating, the thermocouple depends on slower convection heating from the wafer to read wafer temperature. In the time required for the entire thermal mass at the thermocouple tip to reach a given wafer temperature, the wafer itself may have changed to a new temperature. This heating lag causes large measurement errors under dynamic conditions. In addition, thermocouple junctions can deteriorate over time, resulting in unpredictable sources of error in their measurements.

Temperature control systems for high temperature processing chambers are sometimes calibrated using offline experiments with an instrumented wafer, specifically designed for this purpose, onto which calibrated thermocouples are attached. An example of a wafer with thermocouples attached is illustrated in FIG. 2. The wafer undergoes temperature cycling in a processing chamber. A calibration model is developed by comparing temperature measurements from the wafer itself with measurements reported from the chamber measuring system, e.g., thermocouple, pyrometer. These experiments are very intrusive to the deposition system; production must be stopped and considerable time must be taken to set up the experiment and gather the data. Furthermore, the model developed from these offline experiments can neither anticipate nor correct for changes that occur during subsequent wafer processing from, for example, deterioration of the thermocouple junction, movement of the thermocouple, and the transparency of the thermocouple's quartz envelope. It is necessary to have accurate temperature data from production wafers in order to adjust heating in the chamber in accordance with keeping the process temperature within control limits. It is not practical to shut down the reactor and perform additional offline experiments to adjust the model as a routine part of process monitoring.

Optical pyrometers, carefully positioned in the processing chamber, can determine wafer temperature directly by measuring the light radiation emitted by the wafer. Pyrometers react to temperature changes faster than do thermocouples and, therefore, do not significantly lag the wafer temperature. Of course, if direct or reflected light from the heating lamps reaches the pyrometer, light radiation emitted by the wafer may be only a part of the radiation the pyrometer receives, and temperature readings may be in error.

In several commercial systems, a pyrometer temperature measurement from the wafer is used directly as feedback to the heating control system. In order to ensure that only radiation from the wafer reaches the pyrometer, these systems must make significant design compromises, such as through shielding the pyrometer or adjusting the placement of various components. Furthermore, the relationship between wafer temperature and emissivity changes in different temperature ranges. Thus, it is easiest to use pyrometers within specific, discrete temperature ranges, and other factors must be considered when reading temperatures over a very broad range.

Accordingly, a need exists for an apparatus and method for controlling wafer temperature that avoids both the slow response time of thermocouples and the inaccuracies associated with optical pyrometers over large temperature ranges and during periods in the processing cycle when the heating lamps are operating.

SUMMARY OF THE INVENTION

In accordance with one aspect of the present invention, a method of controlling product temperature in a processing chamber using an adaptive process is provided. The product temperature is estimated by an adaptive model using contact type temperature sensor measurements. The model is refined by an adaptation algorithm that uses non-contact type temperature sensor measurements.

In accordance with one aspect of the present invention, a method of controlling substrate temperature in a high temperature processing chamber using a wafer temperature estimator is described. The method comprises supplying non-contact-type temperature sensor measurements to a wafer estimator adaptation controller to develop wafer temperature estimator parameters, using a wafer temperature estimator to provide an estimated wafer temperature from contact-type temperature sensor measurements and the wafer temperature estimator parameters and using the estimated wafer temperature to control the substrate temperature.

In an illustrated embodiment, the method further comprises supplying instrumented wafer offline measurements, contact-type temperature sensor measurements, a radiant heating lamp power setpoint and a physical model to the wafer estimator adaptation controller to develop the wafer temperature estimator parameters. The wafer offline measurements are used by the wafer estimator adaptation controller to develop initial wafer temperature estimator parameters, and the non-contact measurements modify the wafer temperature estimator parameters. The estimated wafer temperature is compared with a temperature setpoint to determine any difference, and power to radiant heating lamps is adjusted to minimize the difference. As processing continues, the wafer temperature estimator parameters are refined using non-contact-type temperature sensor measurements and contact-type temperature sensor measurements taken during periods when the substrate temperature is decreasing or when power to radiant heating lamps is off. In one embodiment, the wafer temperature estimator comprises a linear filter that is adjusted based on wafer temperature estimator parameters from the wafer estimator adaptation controller. In another embodiment, the wafer temperature estimator comprises a nonlinear neural network system that is trained using inputs from the various sensors.

In accordance with another aspect of the invention, a method of calibrating a contact-type sensor in a processing chamber is described. The method comprises measuring the temperature of an object within the chamber during a cool-down portion of the process by using a non-contact type sensor, measuring the temperature of the object by using the contact-type sensor at substantially the same time, comparing the measurement from the non-contact-type sensor to the measurement from the contact-type sensor and refining the measurement of the contact-type sensor based on the comparison, the refining taking effect after the cool-down portion of the process is completed.

In another aspect of the invention, a temperature control system for a semiconductor processing chamber is described. The temperature control system comprises at least one heating element arranged to heat a substrate in the chamber, a contact-type temperature sensor thermally coupled to the substrate and a non-contact-type temperature arranged to measure the temperature of the substrate. A wafer temperature estimator is associated with the non-contact-type sensor for adjusting the measurement of the contact-type sensor to determine an estimated wafer temperature. A temperature controller is associated with the heating element. The temperature controller uses the estimated wafer temperature to control the temperature of the substrate.

In an illustrated embodiment, the heating element comprises a plurality of radiant heating lamps. The contact-type temperature sensor is a thermocouple, and the non-contact-type temperature sensor is a pyrometer.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION OF THE PREFERRED EMBODIMENT

Figure 1:
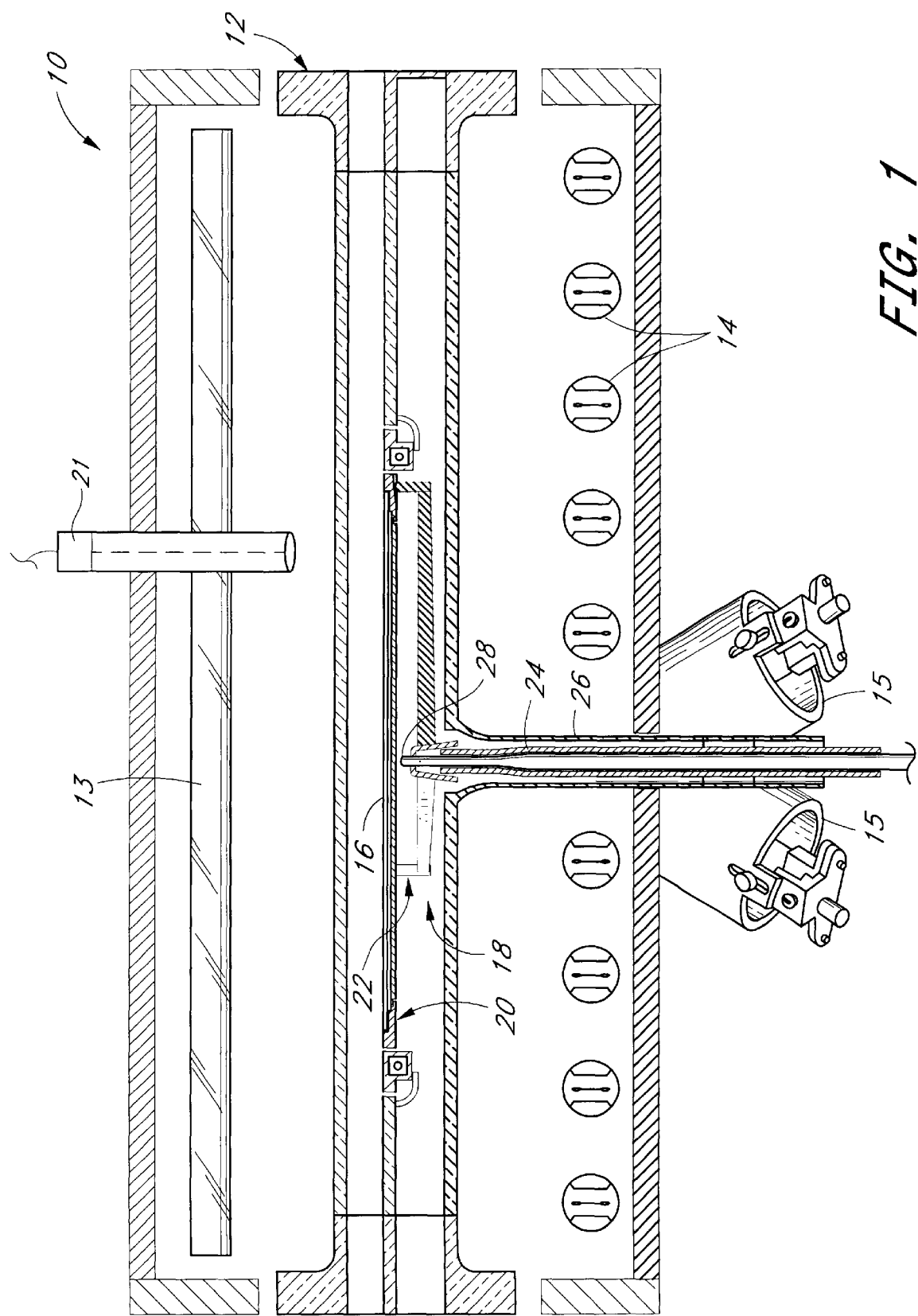
FIG. 1 is a schematic drawing of a high temperature chemical vapor deposition chamber.

In the wafer processing reactor 10 of FIG. 1, a wafer 16 is supported within a reaction chamber 12 upon a wafer support 18. The support 18 includes a spider 22 supporting a susceptor 20 upon which a wafer 16 rests. The spider 22 is mounted to a shaft 24, which extends downwardly through a tube 26 depending from the chamber 12 lower wall.

The reactor 10 is equipped with a heating system comprising radiant heating elements 13, 14 and heating lamps 15, all used to raise the wafer 16 to the process temperature. Each of the elongated tube-type heating elements 13, 14 is preferably a high intensity tungsten filament lamp. Such lamps produce radiant heat energy that is transmitted through the walls of the reaction chamber 12 without appreciable absorption. As is known in the art of semiconductor processing, the power of the various lamps, 13, 14, 15 can be controlled independently or in grouped zones in response to temperature sensors. Process temperatures are normally between about 400° C. and 1200° C.

A contact-type temperature sensor, particularly a thermocouple 28, is shown below the wafer, in close proximity thereto, and is positioned inside the tube 26 that depends from the chamber 12 lower wall. Wafer temperature is also measured with a non-contact sensor 21, such as an optical pyrometer, which has a direct line of sight to the wafer 16. The preferred calibration method that follows can be adapted by those of ordinary skill in the art for other substrates and other arrangements of contact-type and non-contact-type sensors.

In temperature control systems, a thermocouple is sometimes referred to as a contact-type sensor because it is frequently placed in contact with the article where temperature is to be sensed. However, it is sometimes positioned slightly spaced from that article. A thermocouple, of course, senses temperature by thermal transfer with respect to the article to be measured. A sensor of this type shall be referred to in this document as a contact-type sensor, but that term as used herein is intended to include thermocouples that are positioned close to, but not actually contacting, the article to be sensed. Furthermore, "contact-type sensor" is intended to include a temperature sensor that operates by heat transfer even though it is not a thermocouple.

By contrast, a pyrometer is often referred to as a non-contact-type sensor, since it is normally considerably spaced from the article being sensed and measures radiation emitted by the wafer. For purposes of this document, a non-contact-type sensor is intended to include not only a pyrometer but other sensors that can sense temperature remotely.

In general, the proposed temperature control system employs a temperature sensor that measures a raw product temperature and a software-implemented model that converts the raw temperature into an estimated temperature that can be used as a more accurate indicator of the product temperature for purposes of controlling the heating system. In the illustrated embodiment, the model includes both a wafer temperature estimator and an adaptation controller for adjusting the operations performed by the wafer temperature estimator. More generally, the methods and systems disclosed here can be applied to temperature control of any product.

Figure 2:
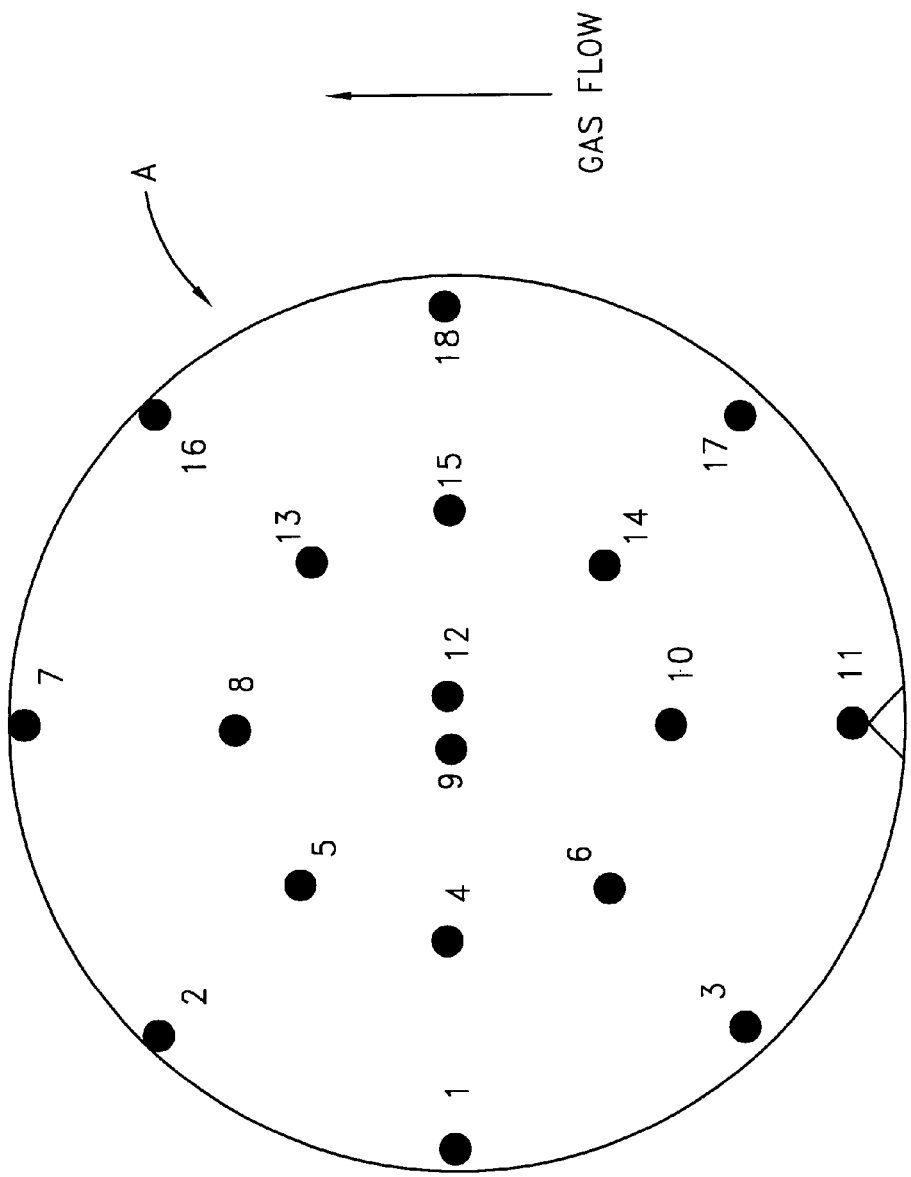
FIG. 2 is a schematic drawing of an instrumented silicon wafer with an array of thermocouples attached to it.

With reference to FIG. 2, an instrumented silicon wafer is used offline to develop an initial wafer estimator adaptation controller. There is an array of calibrated, K-type thermocouples 1–18 attached to the wafer. The wafer is placed in the process chamber and undergoes temperature cycling as for a production wafer, but not actual processing. The wafer temperature estimator parameters are developed initially with these instrumented wafer offline thermocouple measurements, with measurements reported from the chamber measuring system, which can include other thermocouples, pyrometers, etc. and other inputs.

Figure 3:
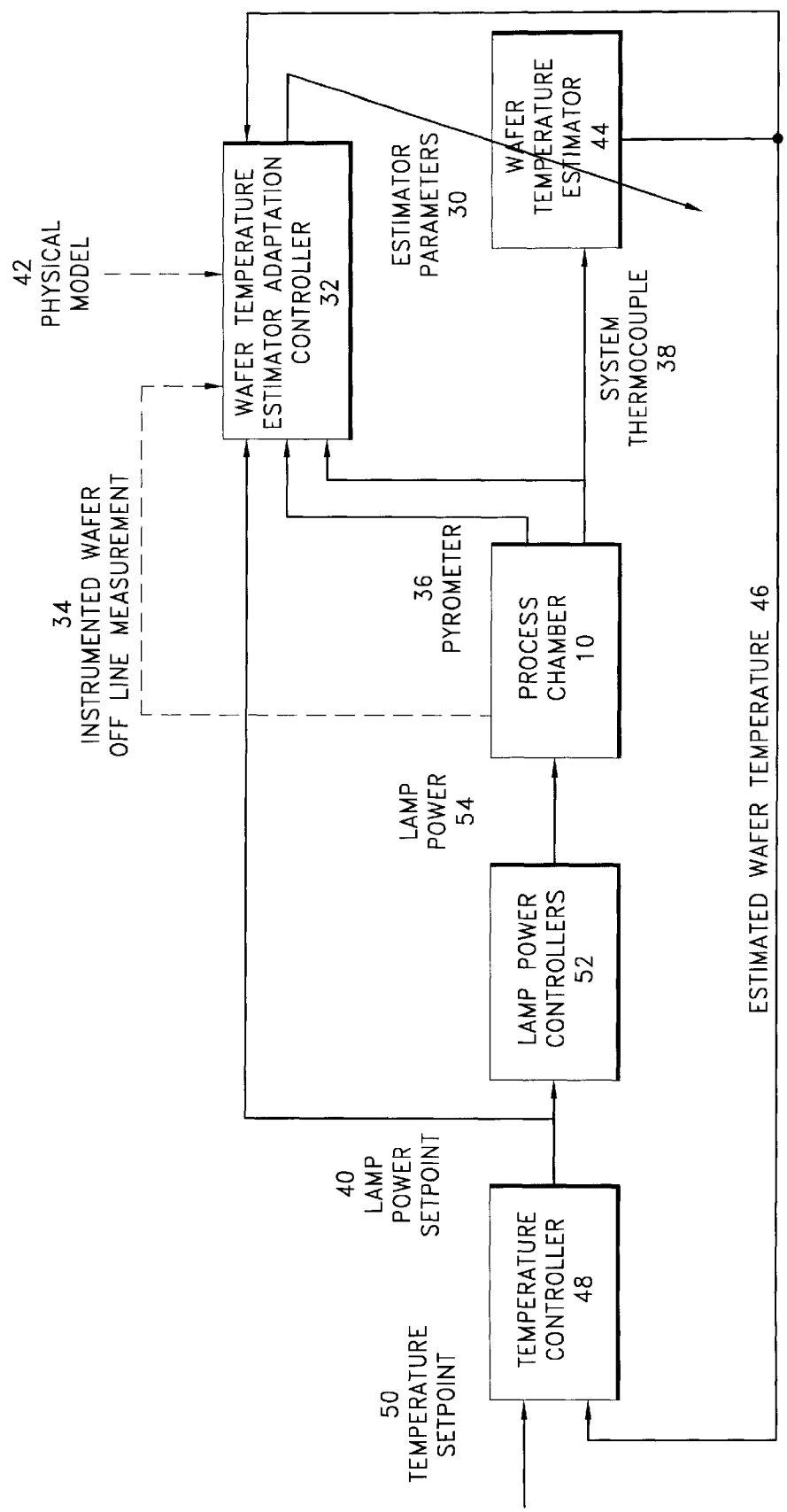
FIG. 3 is a block diagram of a temperature control system comprising a pyrometer calibrated wafer temperature estimator.

With reference to FIG. 3, wafer temperature estimator parameters 30 are developed by the wafer estimator adaptation controller 32 with input from many sources. These sources include, but are not limited to the instrumented wafer offline measurement 34, the pyrometer 36, the system thermocouples 38, the lamp power setpoint 40 and a physical model 42. The physical model 42 can take into account such things as distance between the thermocouple and the wafer and the corresponding steady-state temperature offset parameters to account for this distance. Using these inputs, the wafer temperature estimator adaptation controller 32 develops estimator parameters 30 that are provided to the wafer temperature estimator 44, which incorporates the estimator parameters 30 into a model that adjusts raw measurements from the thermocouples 38 to determine an estimated wafer temperature 46 during processing.

The wafer temperature estimator 44 uses the model to provide an estimated wafer temperature 46 to the temperature controller 48, which compares the temperature setpoint 50 to the estimated wafer temperature 46. The temperature controller 48 makes adjustments to the lamp power setpoint 40 to minimize the difference between the setpoint and the estimated water temperature 46. The estimated temperature 46 is preferably also fed back to the adaptation controller 32 to further refine the estimator parameters 30.

The wafer temperature estimator parameters 30 can be refined with each wafer processed by making measurements during a reduced heating step of the process, such as when the heating lamp power 54 is off. The step change in lamp power 54 during the cooling period provides beginning and end points of a temperature range, which are measured by both the pyrometer 36 and the thermocouples 38. The wafer temperature estimator adaptation controller 32 compares these data and changes the estimator parameters accordingly. These measurements can include nearly the entire temperature range of the process and are very useful for modifying the wafer temperature estimator parameters 30 in response to measurement errors that can occur during processing. Sources of measurement error include, but are not limited to, deterioration of the thermocouple junction, positioning of the thermocouple and transparency of the thermocouple's quartz envelope. In addition, the actual wafer temperature responds much more quickly to changes in lamp power than do the thermocouples, so measurement error is large under dynamic conditions. The wafer temperature estimator parameters 30 are refined with each wafer processed, and preferably, these refined parameters take effect in temperature estimations used by the temperature controller 48 after the cooling period is finished. Thus the model used by the wafer temperature estimator 44 to determine the estimated wafer temperature 46 is kept current with the latest thermocouple and measurement calibration conditions.

Throughout processing of the wafers, thermocouple 38 measurements are sent to the wafer temperature estimator 44, which uses the estimator parameters 30 to convert thermocouple 38 measurements into estimated wafer temperatures 46. In one embodiment, the wafer temperature estimator 44 uses a linear filter whose parameters 30 are adjusted by the adaption controller 32.

In another embodiment, the wafer temperature estimator 44 uses a nonlinear neural network system that is trained using inputs from the various sensors. The estimated wafer temperature 46 is sent on to the temperature controller 48, which compares the estimated wafer temperature 46 to the temperature setpoint 50 and determines whether a change in heating is needed minimize the difference between the setpoint and wafer temperature estimates.

Figure 6:
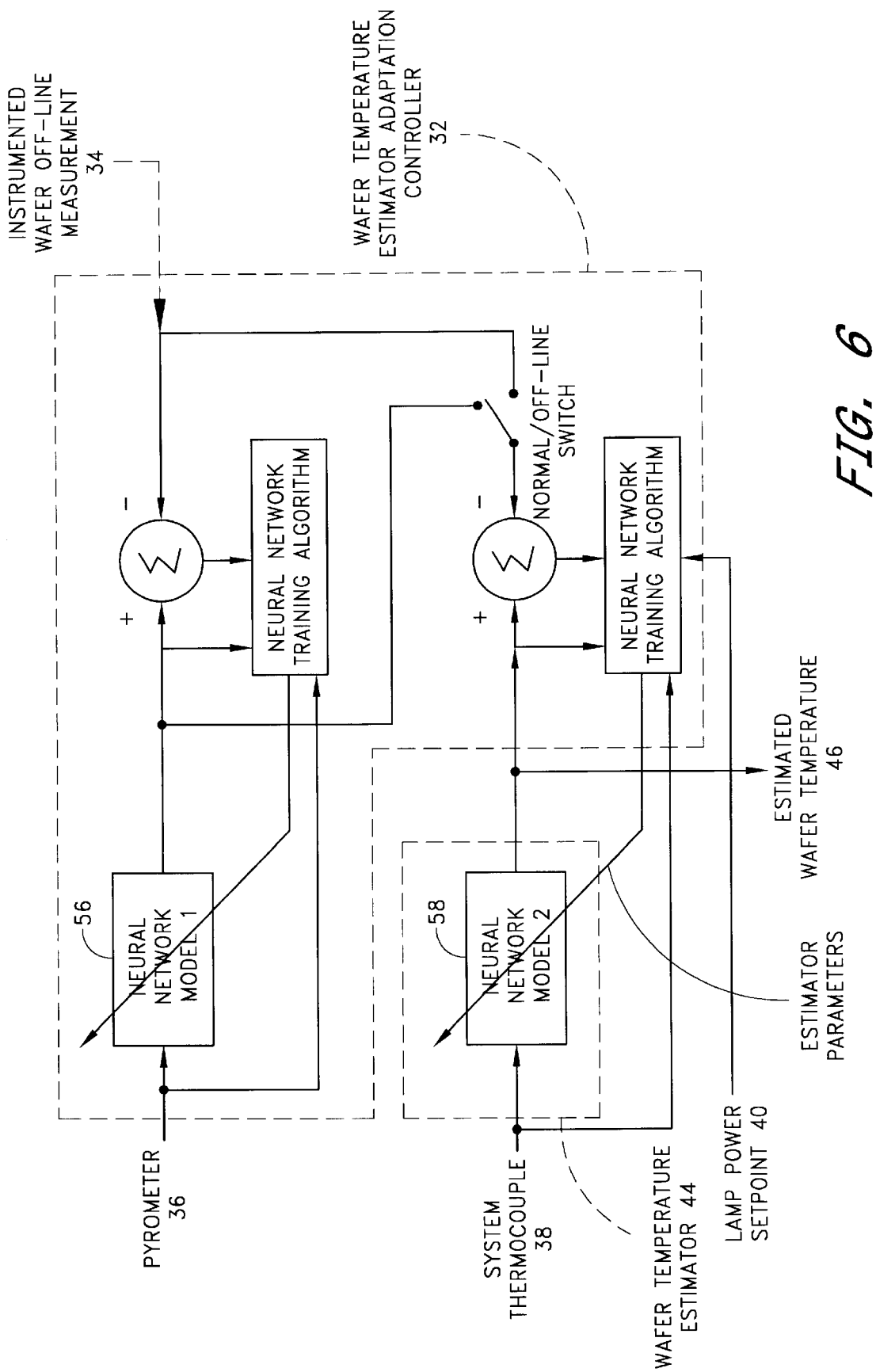
FIG. 6 is a block diagram of a temperature control system of a particular embodiment employing neural networks.

As shown in FIG. 6, the neural network system can include two neural networks: a first network 56 takes pyrometer 36 input and produces a first estimated wafer temperature output 57; and a second network 58 takes thermocouple 38 input and produces a second estimated temperature output 46. Both networks are trained offline with an instrumental wafer 34. The second neural network 58 is retrained, during wafer processing, to output 46 the estimated wafer temperature 57 produced by the first network 56.

Figure 4:
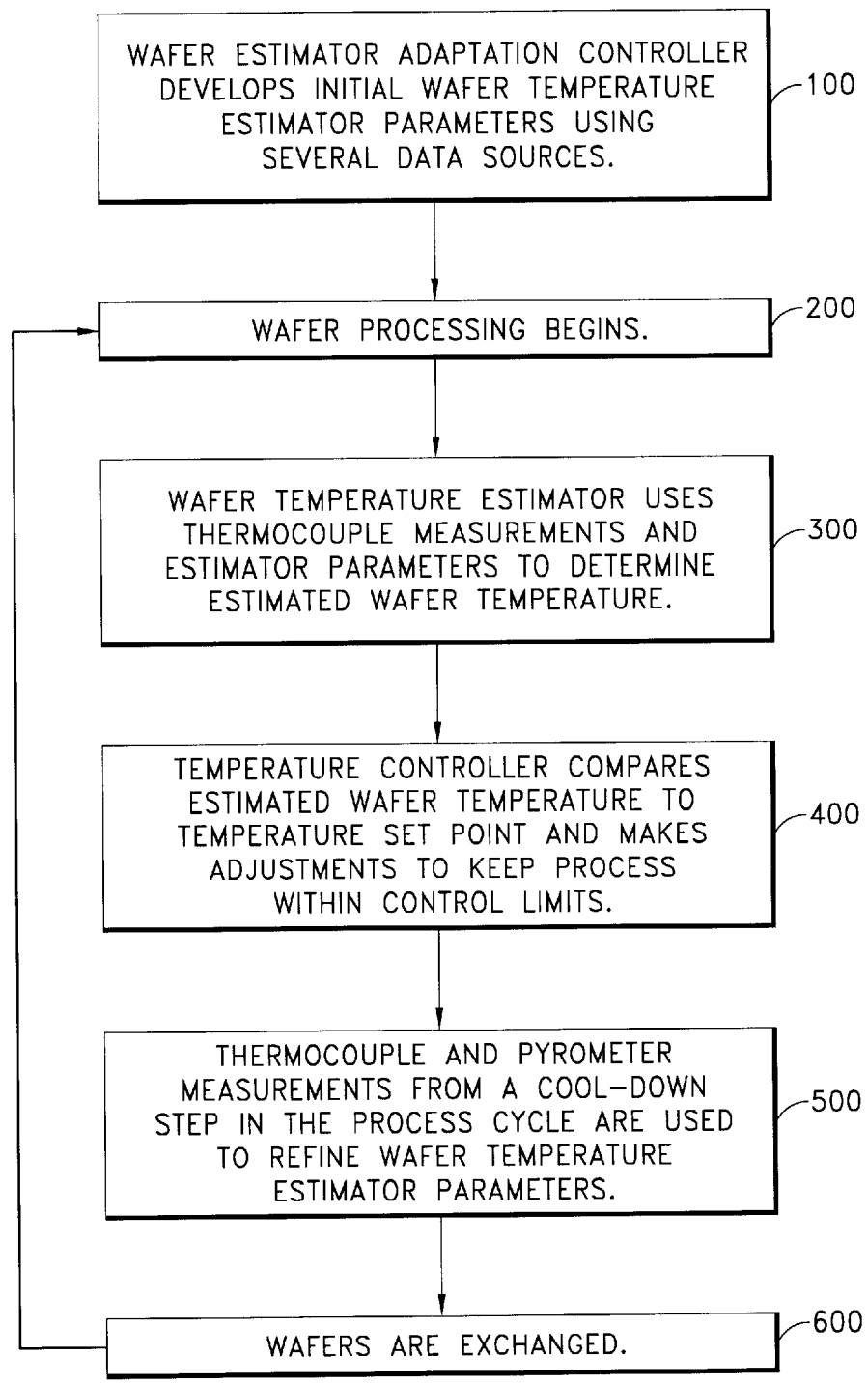
FIG. 4 is a flow chart that outlines the steps in a method of calibrating a wafer temperature estimator with a pyrometer according to a preferred embodiment of the current invention.

The steps of the preferred embodiment are summarized in the flow chart of FIG. 4. In step 100, the wafer estimator adaptation controller develops initial wafer temperature estimator parameters using data from several sources, as discussed above. These sources include, among others, instrumented wafer offline measurements, and a physical model. Wafer processing begins in step 200. During processing, in step 300, the wafer temperature estimator uses thermocouple measurements and estimator parameters to determine estimated wafer temperature. In step 400, the temperature controller compares the estimated wafer temperature to the temperature setpoint and makes adjustments to the lamp power to minimize the difference between setpoint and the estimated temperature. During a subsequent cool down portion of the process cycle, in step 500, the wafer temperature estimator parameters, and therefore the estimated wafer temperature, are refined by measuring the wafer temperature with both the thermocouple and the pyrometer. Preferably, the refinement is used after the cool down is complete. In step 600, the processed wafer is removed from the chamber, and a new wafer is introduced. Processing the new wafer proceeds beginning at step 200.

Figure 5:
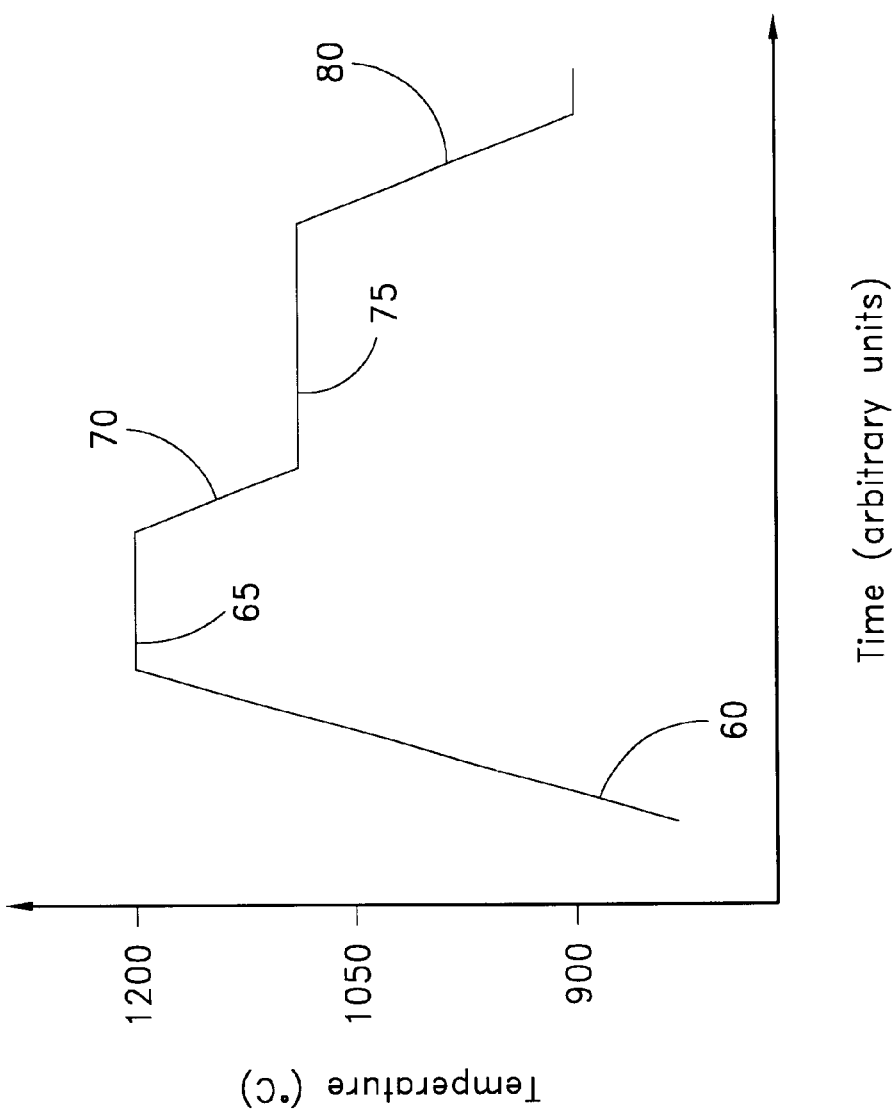
FIG. 5 is a time-temperature plot of an exemplary process that uses a pyrometer calibrated wafer temperature estimator.

Wafer processing steps are illustrated in the graph of FIG. 5, which is a time-temperature plot of an exemplary epitaxial deposition process with a preliminary bake step. In the following description, reference is made also to system components shown in FIG. 3. The identifying numbers of the components from FIG. 3 are shown in parentheses.

In FIG. 5, a first semiconductor wafer processing step 60 is shown as a temperature ramp to about 1200° C. The wafer is held at 1200° C. for a hydrogen bake 65. During the hydrogen bake 65, the power to the heating lamps is controlled by the temperature controller (48) by comparing the estimated wafer temperature (46) from the wafer temperature estimator (44) to the temperature setpoint (58). At the completion of the hydrogen bake 65, the heating is stopped or reduced, causing the temperature to drop 70 until it reaches about 1080° C. Optionally, while the temperature is dropping 70 in this intermediate cooling step, adjustments to the wafer temperature estimator parameters (30) based on both thermocouple (38) and pyrometer (36) measurements can be made. Next, the temperature is held constant at about 1080° C. for epitaxial deposition 75. The temperature is controlled by the temperature controller (48), as described above for process step 65. When epitaxial deposition 75 is complete, heating is stopped and the temperature is reduced

80. In step 80, as the temperature drops to 900° C., adjustments to the wafer temperature estimator parameters (30) can be made as described above for step 70.

Those of ordinary skill in the art will readily understand the advantages in the current apparatus and method for controlling the calibration of temperature readings from wafers during processing. No design compromises are necessary in introducing the pyrometer into the processing chamber. The pyrometer is able to work to its best advantage by operating when the heating elements have been switched off. The thermocouple undergoes an initial calibration that is updated with measurements from both the pyrometer and the thermocouple with each wafer processed to ensure that drift in the thermocouple measurements are caught quickly and appropriate changes in calibration are made as needed.

Hence, although the foregoing description of the preferred embodiments of the present invention has shown, described and pointed out the fundamental novel features of the invention, it will be understood that various omissions, substitutions and changes in the form of the detail of the apparatus as illustrated as well as the uses thereof may be made by those skilled in the art, without departing from the spirit of the present invention. Consequently, the scope of the present invention should not be limited to the foregoing discussion, but should be defined by the appended claims.

We claim:

1. A method of controlling product temperature in a processing chamber using an adaptive process, comprising:
   an adaptive model for estimating the product temperature based on contact type temperature sensor measurements; and
   an adaptation algorithm that uses non-contact type temperature sensor measurements for refining the contact type based adaptive model.

2. The method of claim 1, wherein the product is a silicon wafer.

3. The method of claim 1, wherein the adaptive model comprises a wafer temperature estimator adaptation controller and a wafer temperature estimator, the wafer temperature estimator adaptation controller determining estimator parameters as the product temperature is reduced.

4. A method of controlling substrate temperature in a high temperature processing chamber using a wafer temperature estimator, comprising:
   supplying non-contact-type temperature sensor measurements to a wafer estimator adaptation controller to develop wafer temperature estimator parameters;
   using a wafer temperature estimator to provide an estimated wafer temperature from contact-type temperature sensor measurements and the wafer temperature estimator parameters;
   using the estimated wafer temperature to control the substrate temperature; and
   supplying instrumented wafer offline measurements, contact-type temperature sensor measurements, a radiant heating lamp power setpoint to develop the wafer temperature estimator parameters.

5. The method of claim 4, wherein the wafer offline measurements are used by the wafer estimator adaptation controller to develop initial wafer temperature estimator parameters, and the non-contact measurements modify the wafer temperature estimator parameters.

6. The method of claim 5, wherein using the estimated wafer temperature to control the substrate temperature further comprises comparing the estimated wafer temperature with a temperature setpoint to determine any difference and adjusting power to radiant heating lamps to minimize the difference.

7. The method of claim 6, wherein the wafer temperature estimator parameters are refined using non-contact-type temperature sensor measurements and contact-type temperature sensor measurements taken during periods when the substrate temperature is decreasing.

8. The method of claim 7, wherein the wafer temperature estimator comprises a nonlinear neural network system that is trained using instrumented wafer measurements, contact-type temperature sensor measurements and non-contact-type temperature sensor measurements.

9. The method of claim 8, wherein the neural network system comprises
   a first neural network having non-contact temperature sensor measurement input and a first estimated wafer temperature output; and
   a second neural network with contact-type temperature sensor measurement input and a second estimated wafer temperature output,
   wherein both networks are trained to output the instrumented wafer measurements in an off-line mode and
   the second neural network is retrained to output the first estimated wafer temperature output generated by the first neural network during wafer processing.

10. The method of claim 6, wherein the wafer temperature estimator parameters are refined using non-contact-type temperature sensor measurements and contact-type temperature sensor measurements taken during periods when power to radiant heating lamps is off.

11. The method of claim 6, wherein the wafer temperature estimator comprises a linear filter that uses parameters from the wafer estimator adaptation controller.

12. A method of refining thermocouple measurements during wafer processing in a chemical vapor deposition chamber, comprising:
   initially heating a wafer by radiant heating lamps;
   controlling power to the lamps using thermocouple temperature measurements and a wafer temperature estimator;
   comparing pyrometer temperature measurements and the thermocouple temperature measurements, wherein comparing is performed after the heating step and while the temperature is dropping; and
   using the pyrometer measurements to modify the wafer temperature estimator to improve the temperature estimate.

13. The method of claim 12, wherein comparing is triggered by a step change in power applied to the radiant heating lamps.

14. The method of claim 13, wherein comparing is triggered by shutting off the power applied to the radiant heating lamps.

15. A method of temperature control during wafer processing in a chemical vapor deposition chamber comprising:
   developing initial wafer temperature estimator parameters before processing product wafers;
   using temperature measurements from both a pyrometer and a thermocouple during periods in a process cycle when radiant heating lamps are off to refine the initial wafer temperature estimator parameters as processing continues, thereby producing refined wafer temperature estimator parameters;
   using thermocouple measurements and the refined wafer temperature estimator parameters to determine an estimated wafer temperature;
   comparing the estimated wafer temperature to a temperature setpoint to determine any difference; and adjusting power to radiant heating lamps to minimize the difference.

16. A method of calibrating a contact-type sensor in a processing chamber, comprising:

measuring the temperature of an object within the chamber during a cool-down portion of the process by using a non-contact type sensor;

measuring the temperature of the object by using the contact-type sensor at substantially the same time;

comparing the measurement from the non-contact-type sensor to the measurement from the contact-type sensor; and refining the measurement of the contact-type sensor based on the comparison.

17. A temperature control system for a semiconductor processing chamber, comprising:

at least one heating element arranged to heat a substrate in the chamber;

a contact-type temperature sensor thermally coupled to the substrate;

a non-contact-type temperature measurement system arranged to measure the temperature of the substrate;

a wafer temperature estimator associated with the non-contact-type sensor for adjusting the measurement of the contact-type sensor to determine an estimated wafer temperature; and a temperature controller associated with the heating element and receiving the wafer temperature estimator for using the estimated wafer temperature to control the temperature of the substrate.

18. The apparatus of claim 17, wherein the heating element comprises radiant heating lamps.

19. The apparatus of claim 17, wherein the contact-type temperature sensor is a thermocouple.

20. The apparatus of claim 17, wherein the non-contact-type temperature sensor is a pyrometer.

21. The method of claim 1, wherein the adaptor model is based on contact type temperature sensor measurements obtained as the product temperature decreases.

* * * * *